(12) United States Patent
Hoeber et al.

(10) Patent No.: US 6,248,950 B1
(45) Date of Patent: *Jun. 19, 2001

(54) SOLAR ARRAY AUGMENTED ELECTROSTATIC DISCHARGE FOR SPACECRAFT IN GEOSYNCHRONOUS EARTH ORBIT

(75) Inventors: Christopher F. Hoeber, Los Altos; Howard E. Pollard, Saratoga; Michael J. McVey, Palo Alto; Robert E. Neff, Fremont, all of CA (US)

(73) Assignee: Space Systems/Loral, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,466

(22) Filed: Feb. 21, 1998

(51) Int. Cl.⁷ .................. H01L 31/0203; H01L 31/048
(52) U.S. Cl. .................. 136/251; 136/244; 136/259
(58) Field of Search .................. 136/244, 251, 136/259, 252, 293, 249

(56) References Cited

U.S. PATENT DOCUMENTS

| | | |
|---|---|---|
| 3,696,286 * | 10/1972 | Ule .................. 323/15 |
| 4,401,839 * | 8/1983 | Pyle .................. 136/251 |
| 4,413,157 * | 11/1983 | Ames .................. 136/248 |
| 4,542,578 * | 9/1985 | Yamano et al. .................. 29/572 |
| 4,609,770 * | 9/1986 | Nishiura et al. .................. 136/244 |
| 4,754,544 * | 7/1988 | Hanak .................. 437/2 |
| 5,006,179 * | 4/1991 | Gaddy .................. 136/244 |
| 5,236,516 * | 8/1993 | Noguchi et al. .................. 136/246 |
| 5,389,159 * | 2/1995 | Kataoka et al. .................. 136/251 |
| 5,542,988 * | 8/1996 | Bogus .................. 136/244 |
| 5,637,155 * | 6/1997 | Inoue .................. 136/244 |
| 5,637,156 * | 6/1997 | Kubota et al. .................. 136/251 |
| 5,688,337 * | 11/1997 | Mosher .................. 136/244 |

* cited by examiner

Primary Examiner—Harold Pyon
Assistant Examiner—Michael C. Miggins
(74) Attorney, Agent, or Firm—Kenneth W. Float (57) ABSTRACT

Improved solar cell circuit layouts and cell structures that protect solar arrays located on spacecraft disposed in geosynchronous earth orbit from electrostatic discharge. An insulating material, such as RTV adhesive, for example, is used as a barrier that disposed in intercell gaps between solar cells. The use of the insulating material modifies sparking in the gaps caused by electrostatic discharge so that, while the spark still occurs, it has different non-destructive characteristics. The use of the insulating material causes no damage to other solar cell materials, such as a Kapton insulating layer or substrate used to support the solar cells. Furthermore, unique solar cell wiring schemes are provided that limit the voltage between adjacent solar cells to 50 volts or less.

19 Claims, 11 Drawing Sheets

SOLAR ARRAY AUGMENTED ELECTROSTATIC DISCHARGE FOR SPACECRAFT IN GEOSYNCHRONOUS EARTH ORBIT

BACKGROUND

The present invention relates generally to solar arrays used on spacecraft, and more particularly, to improved solar cell circuit layouts and solar cell structures for protecting solar arrays located on spacecraft disposed in geosynchronous earth orbit from electrostatic discharge.

During 1997, the assignee of the present invention launched five high-powered spacecraft which generate over 10 kW of electrical power at the beginning of their life. On two of those spacecraft there has been damage to the solar arrays during the first year of operation. Extensive analysis and ground testing has demonstrated that a damage mechanism exists in which electrostatic discharges occurring between pieces of cover glass and the solar cells on the solar arrays can be sustained by current from the solar array itself. Depending on the physical construction of the array, local heating can cause pyrolization of the insulation which separates the solar cells from the conductive substrate, thus resulting in short circuits of individual strings of solar cells. Susceptibility to this phenomenon is likely to increase throughout the industry as spacecraft power increases lead to larger solar arrays operating at higher voltages. However, analytical modeling and laboratory experimentation have verified the phenomenon and validated the preventative actions undertaken by the assignee of the present invention so that this phenomenon can be controlled on future spacecraft.

It would therefore be desireable to provide for technical approaches that protects solar cells on geosynchronously orbiting spacecraft from damage caused by electrostatic discharge. Accordingly, it is an objective of the present invention to provide for improved solar cell circuit layouts and cell structures for protecting solar arrays located on spacecraft disposed in geosynchronous earth orbit from electrostatic discharge.

SUMMARY OF THE INVENTION

To accomplish the above and other objectives, the present invention comprises improved solar cell circuit layouts and cell structures that protect solar arrays located on spacecraft disposed in geosynchronous earth orbit from electrostatic discharge. The present invention provides for the use of an insulating material as a barrier, such as using room temperature vulcanizable (RTV) adhesive or insulating material, for example, disposed in intercell gaps between solar cells. The use of such insulating material modifies sparking in the gaps caused by electrostatic discharge so that, while the spark still occurs, it has different non-destructive characteristics. The use of the insulating material causes no damage to other solar cell materials, such as Kapton insulating material disposed between the solar cells and the substrate to support the cells. Furthermore, unique solar cell wiring schemes are provided that limit the voltage between adjacent cells to 50 volts or less.

In developing the present invention, a model was developed for spacecraft charging that shows that the solar panels of large geosynchronous earth orbit communications satellites can exhibit an "inverse potential gradient" in which the solar cell cover glass charges less negatively than the spacecraft body. The amount of inverse potential gradient is strongly dependent on the bulk resistivity of the cover glass.

A model of the arc discharge that can result from this potential gradient was also developed that shows that a plasma created by the discharge can trigger a sustaining arc, with current fed from the array itself. It has been found that there is a threshold cell-to-cell differential voltage below which the sustaining arc cannot be created, which may be why it has not been a problem with spacecraft in the past.

The arc discharge model has been verified by testing at NASA Lewis Research Center. This verification has shown that arrays that have been flown with high reliability for years (such as Intelsat VII, for example) can fail if they are operated at sufficiently high cell-to-cell voltage. Although heritage construction processes have been used, for both high power 100 V GaAs and Si arrays developed by the assignee of the present invention, the threshold for damage has been shown to be just at the limit of the normal operating range. The fact that the high power Si arrays currently in use have not been damaged can be attributed to detailed construction differences and it may be strongly influenced by the use of cover glass having a relatively low bulk resistivity.

In implementing the present invention, a number of construction techniques have been developed to provide a margin against failure from the secondary arc. Once the failure mechanism was understood, combining these techniques provides a very large margin to prevent the arc discharge phenomenon from occurring in the future. The corrective action implemented on future spacecraft to be launched by the assignee of the present invention will provide a safety margin significantly higher than that of previous solar arrays that have operated successfully for years.

Regarding the specifics in producing a solar array in accordance with a preferred embodiment of the present invention, the intercell voltage differential is lowered by 62.5% by rewiring the solar panels, the voltage threshold at which damage can occur is increased by a factor of 3 to 4 by adding the insulating material barrier between cells, and the current available to the arc is decreased by a factor of 2 to 3 by adding solar cell string isolation diodes.

The susceptibility of solar arrays to electrostatic damage is a function of their construction details, which determines how susceptible they are to damage. However, using the principles of the present invention, solar arrays can safely be produced that operate at today's 10 kW power levels, and that will also operate at significantly higher power levels that will be used in the near future.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
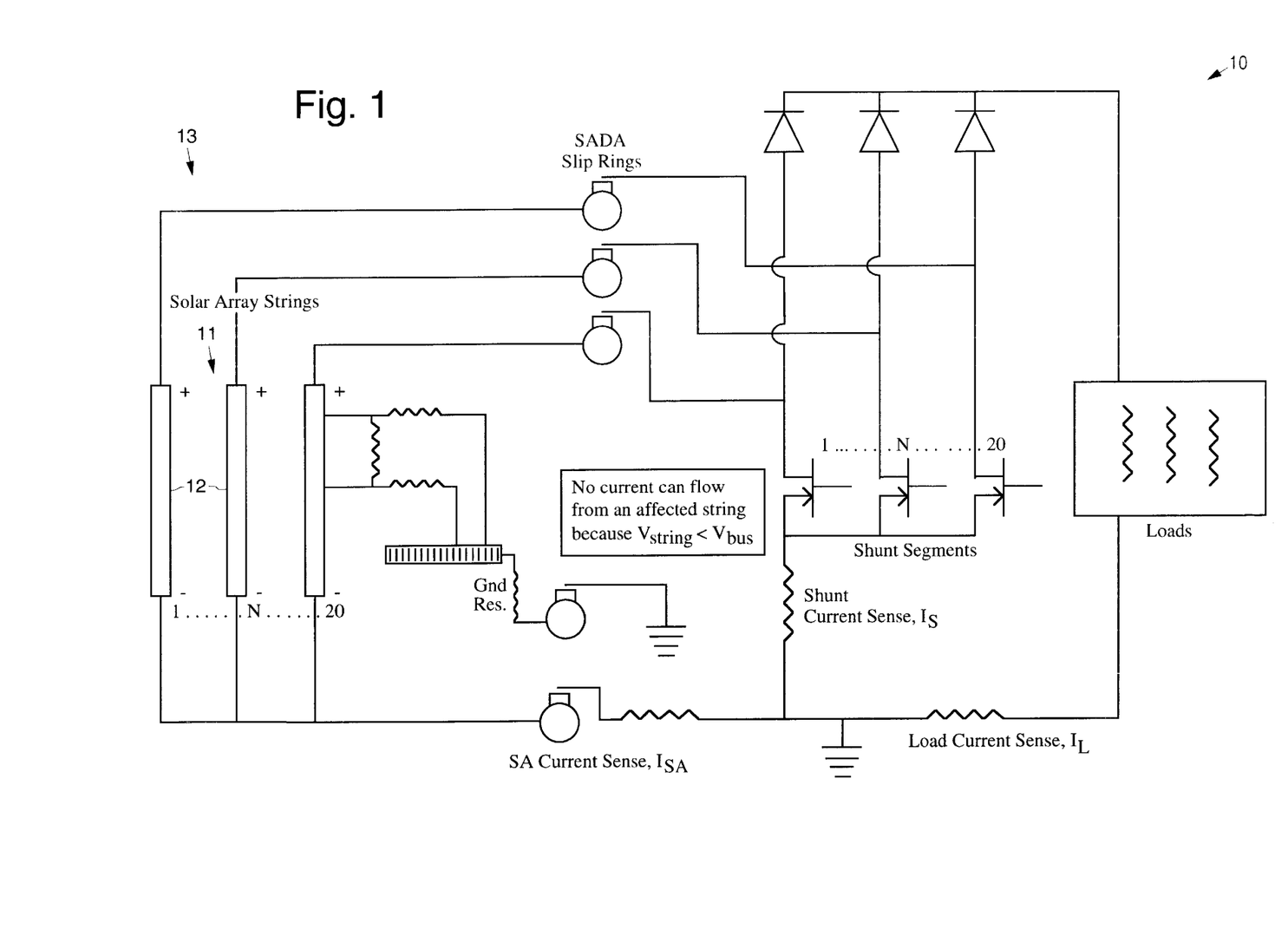
FIG. 1 illustrates a spacecraft anomaly that is corrected by the present invention.

Referring to the drawing figures, and in particular FIG. 1, anomalies observed on spacecraft 10 deployed by the assignee of the present invention are consistent with failures of strings 11 of solar cells 12 on solar arrays 13 (solar panels 13). The symptoms of the failures are low impedance shorts between solar cells 12 at different points within a string 11, and shorts between high voltage solar cells 12 and the array ground. All of the anomalies occurred when other instrumented satellites measured a charging environment characteristic of a solar substorm.

In a paper by Katz, et al. entitled "Mechanism for Spacecraft Charging Initiated Destruction of Solar Arrays in GEO," 36th AIAA Aerospace Sciences Meeting and Exhibit, 1998, a theory and supporting laboratory data were presented, showing how small, low energy, spacecraft charging arcs on solar arrays can lead to larger, sustained discharges, in turn leading to permanent damage of the solar arrays 13. Since the Katz, et al. publication, additional work preformed by the assignee of the present invention has led to an understanding of the phenomenon, of the existence of a cell-to-cell voltage threshold below which the sustaining arc cannot occur, and of the appropriate preventative action. Each step of this theoretical understanding has been empirically verified.

Figure 2:
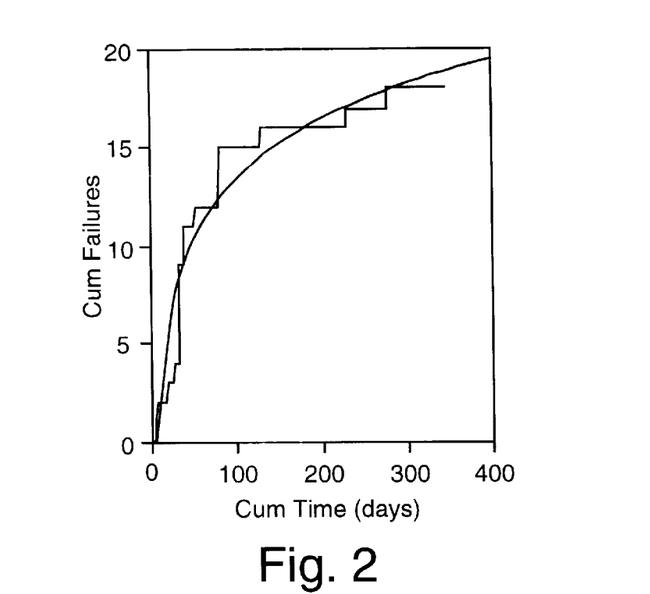
FIG. 2 illustrates failure rate of a spacecraft as a function of time since launch.

Two of the spacecraft 10 developed by the assignee of the present invention use Gallium Arsenide (GaAs) solar cells 12. These are the two spacecraft 10 that have suffered damage, with 18 out of 80 circuits (22%) having been damaged. FIG. 2 shows the cumulative failure history as a function of time since the launch of the spacecraft 10. As can be seen, the failure rate has decreased significantly with time.

The remaining three arrays 13 use Silicon (Si) solar cells 12. One of the 120 circuits on these spacecraft 10 has suffered an anomaly. Its signature is different from the others described herein, and it is not possible to tell from data available on the ground whether or not it is from the same cause. As will be shown, the likelihood of damage is a function of many of the detailed construction parameters of the array 13. Although the arrays 13 discussed herein are GaAs and Si, one should not conclude that GaAs, per se, is any more susceptible to damage than Si.

Spacecraft charging analysis using the NASA Charging Analyzer Program (NASCAP) is discussed in a paper by Katz, et al. entitled "The Capabilities of the NASA Charging Analyzer Program," *Spacecraft Charging Technology— 1978*, NASA CP-2071, AFGL-TR-79-0082, edited by R. C. Fincke and C. P. Pike, p. 101, 1979. This paper identified the solar arrays 13 as the probable site of spacecraft charging initiated arcs.

For decades it has been known that 30–50 keV electrons in the magnetosphere can cause electrostatic potentials of several thousand volts to develop between different surfaces on the same spacecraft 10. Flight observations have shown that the large potential differences can lead to arc discharges. This phenomenon is discussed in papers by DeForest, entitled "Spacecraft Charging at Synchronous Orbit", *J. Geophys. Res.*, 77, p 651, 1972, Mullen et al., entitled "Scatha Survey of High-Level Spacecraft Charging in Sunlight", *J. Geophys. Res.*, 91, p. 1474, 1986, and Koons, entitled "Summary of Environmentally Induced Electrical Discharges on the P78-2 (SCATHA) Satellite", *J. Spacecraft and Rockets*, 22, p 425, 1983. Modem geosynchronous communications satellites are typically covered with conducting surfaces to prevent surface potential differences and arcing. The only nonconducting surfaces are usually pieces of solar cell cover glass 16 (shown in FIGS. 7–11 and most clearly in FIG. 19).

The NASCAP program was used to analyze the electrical charging expected on the spacecraft 10, and to locate possible discharge sites. Because the actual environment is unknown, the calculations were performed using the NASA recommended "worst case" charging environment discussed in a paper by Purvis et al. entitled *"Design Guidelines for Assessing and Controlling Spacecraft Charging"*, NASA TP 2361, 1984. Parameters of the "worst case" charging environment are $n_e=1.12\times10^6$ m$^{-3}$, $T_e=12$ keV, $n_i=2.36\times10^5$ m$^{-3}$, and $T_i=29.5$ keV.

Figure 3:
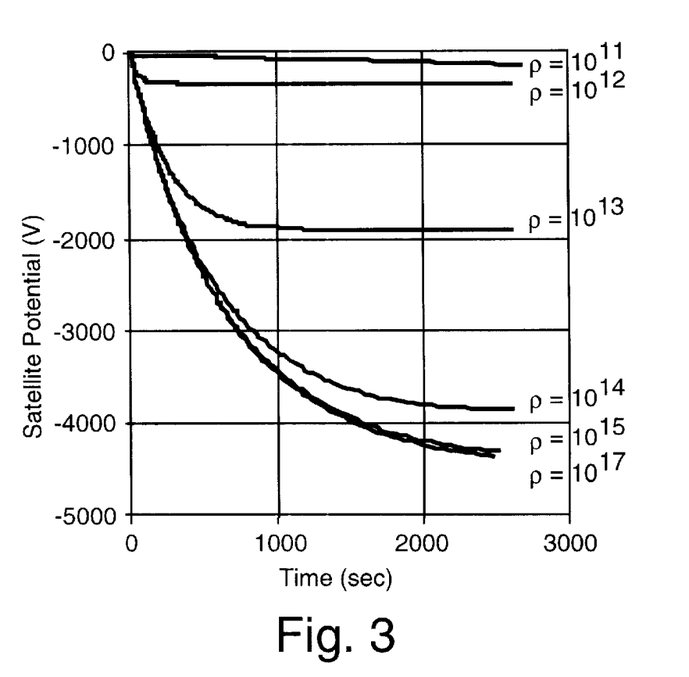
FIG. 3 illustrates spacecraft charging as a function of cover glass resistivity.

The analysis shows that a spacecraft 10 charges during substorms, even when it is in sunlight. The reason is that photoemission from the relatively small conducting area that is sunlit is exceeded by the charging currents to the large conducting areas that is in the dark if the front surface of the solar arrays 13 is steered towards the sun. In the presence of a charging environment, the chassis of the spacecraft 10 charges negative at an initial rate of about −5 V/s, as is shown in FIG. 3.

Figure 4:
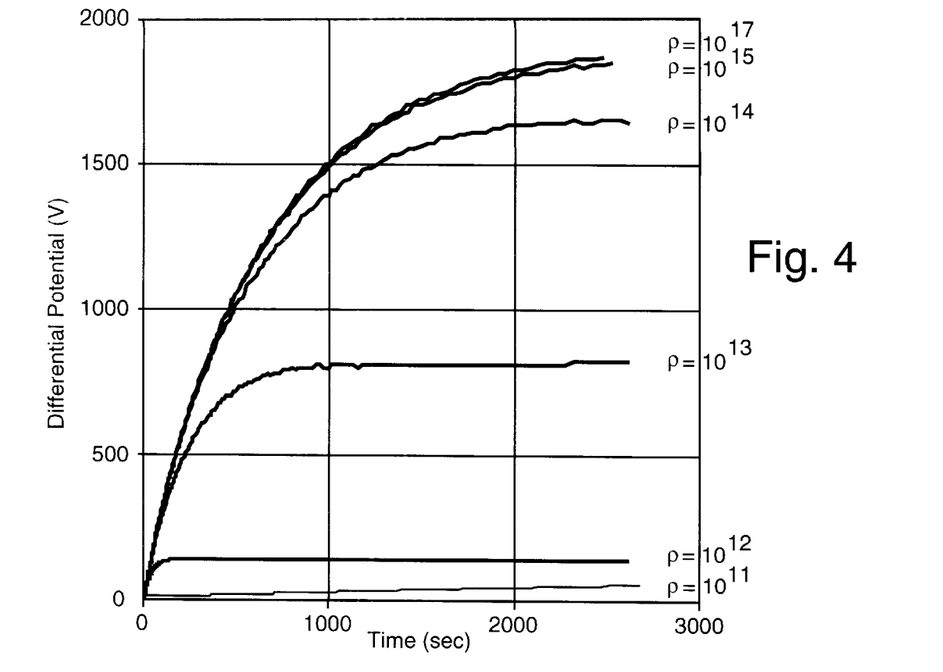
FIG. 4 illustrates cover glass differential charging as a function of cover glass resistivity.

The front surface of the solar array 13, however, always faces the sun, and charge from the cover glass 16 is constantly bled off via photoemission (except during an eclipse, when the arrays 13 do not produce power). This leads to an inverted potential gradient in which the pieces of the cover glass 16 are less negatively charged than the underlying cell material and metallic interconnects. As is shown in FIG. 4, the potential difference between the cover glass 16 and the underlying cell increases at an initial rate of about 3 V/s. The photoemission current maintains the cover glass 16 near ambient potential.

Initially, the resistivity of the cover glass 16 was modeled as being effectively infinite. Further examination, revealed however, that if the bulk resistivity, ρ, of the cover glass 16 was less than about $10^{13}$ Ω-m, then the maximum charge might be held below the threshold of electrostatic discharges. For example, for a cover glass 16 having a resistivity of $10^{13}$ Ω-m, the maximum voltage is limited as follows:

$$V = (\rho \times t)I$$
$$= 8 \times 10^{12} \times 125 \times 10^{-6})10^{-6}$$
$$= 1000V,$$

where ρ=weighted average of the resistivity (Ω-m) of the cover glass and adhesive, t=100 microns of glass and 25 microns of adhesive, and I=$10^{-6}$ A/m$^{-2}$.

Figure 5:
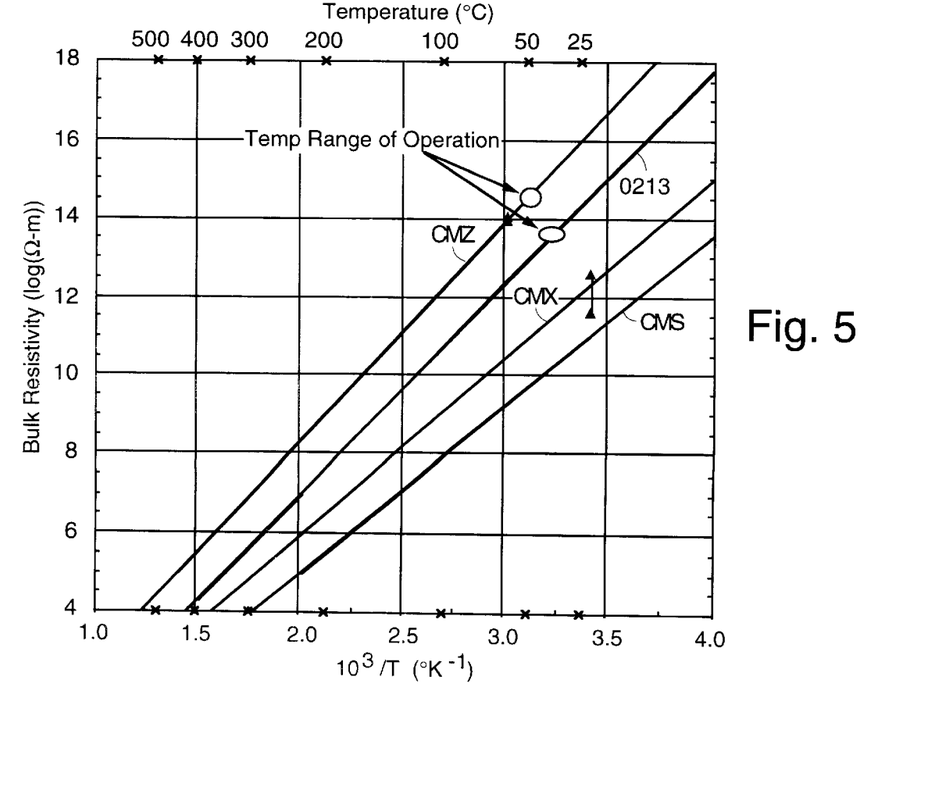
FIG. 5 illustrates cover glass resistivity.

FIG. 5 shows the bulk resistivity for various materials used in cover glass 16. As can be seen, the resistivity of CMZ cover glass 16, which has been used on GaAs arrays 13 produced by the assignee of the present invention, is high enough that it does not significantly limit the charging voltage. The resistivity of 0213 cover glass 16, which is used on both Si arrays and GaAs arrays now under construction by the assignee of the present invention, is sufficiently low that it reduces the maximum charge potential. The exact value is a function of the charging environment, as well as the exact temperature of the solar array 13 at the time. This is one possible explanation for the fact that the Si arrays 13 have not experienced troubles on orbit. For future spacecraft 10, by the assignee of the present invention is investigating switching to CMX or other lower resistivity cover glass 16 as standard practice.

Figure 6:
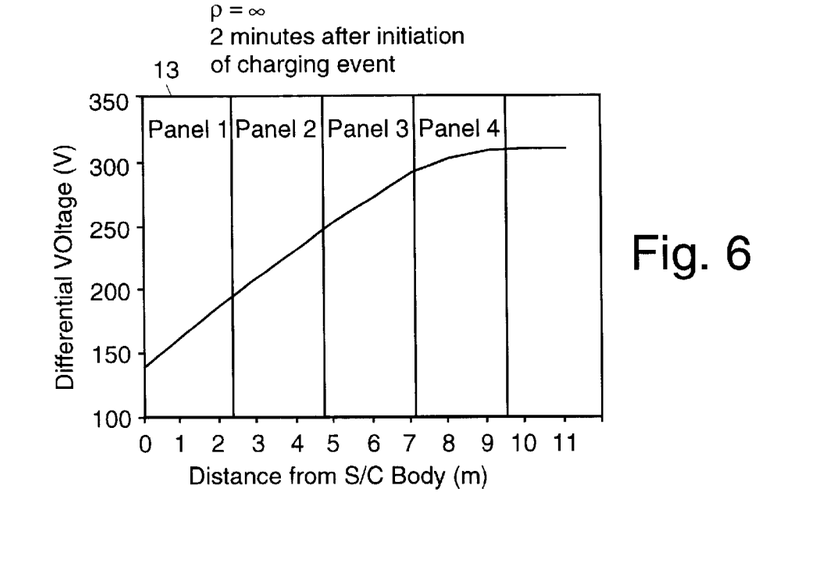
FIG. 6 illustrates cover glass charging potential as a function of distance from the spacecraft main body.

The final step of the charging analysis is the recognition that the electrostatic potential is not constant along the array 13, increasing as the distance from the main body of the spacecraft 10 increases. FIG. 6 illustrates this, for a snapshot two minutes after a charging event is initiated, assuming infinite cover glass resistivity.

As can be seen in FIG. 6, the voltage on the fourth panel 13 is over 300 V, decreasing to 140 V on the first panel 13. Of the 18 failures on orbit, 7 have occurred on the fourth panel 13, or outermost panel 13, 4 on the third panel 13, and 2 on the first panel 13. The location of the remaining 5 failures is not known precisely, but it is known that they are not on the first panel 13. The inference is clear. in that, discharges occur first on the outermost panel 13. Once a discharge occurs, the spacecraft 10 is neutralized and the charging is reinitialized. If discharging continues to occur preferentially on the outermost panel 13, this will protect the inboard panels 13. The fact that failures occurred very early in life on the outermost panels 13 and have decreased significantly in frequency suggests that the remaining portion of the solar arrays 13 may continue to operate normally for the rest of the lifetime of the spacecraft 10.

The arcs described above have insufficient energy or currents to lead to permanent failures in the power system of the spacecraft 10. Further analysis suggested that the short duration spacecraft charging arcs could trigger long duration discharges between solar cells 12; these discharges supported by the solar array current itself. The long duration discharges dissipate substantial energy, and can cause permanent damage to Kapton insulating material 19 (FIG. 19) on which the solar cells 12 are mounted. The effect on the Kapton material 19 is to turn this high resistance polymer into a low resistance carbonized ash. This process, pyrolysis, was previously reported in a paper by Stueber et al., entitled "Evaluation of Kapton Pyrolysis, Arc Tracking, and Flashover on SiOx-Coated Polyimide, Insulated Samples of Flat Flexible Current Carriers for SSF", NASA-CR 191106, 1993. The net effect is to short out the string 11 of solar cells 12, either between high and low voltage cells 12, or between cells 12 at different positions in the string 11 and the underlying substrate 18 which is at spacecraft chassis ground potential, as shown in FIG. 1.

Figure 7:
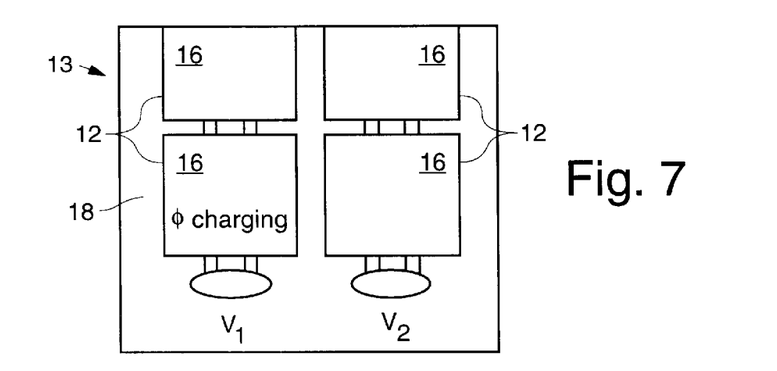
FIG. 7 illustrates solar cells charge in response to space environment.
Figure 8:
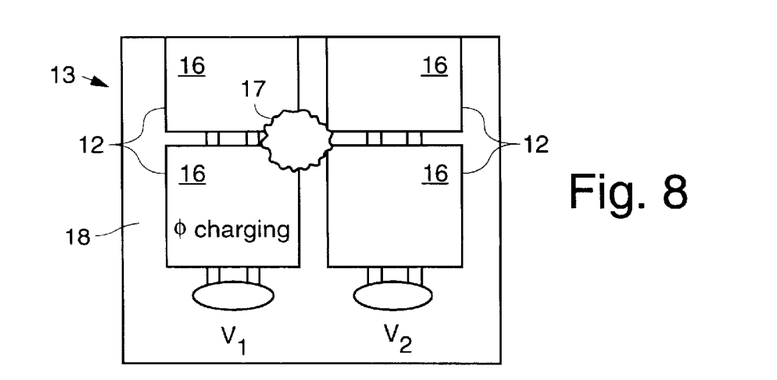
FIG. 8 illustrates that spacecraft charging causes a small arc to occur in the gap between the solar cells.
Figure 9:
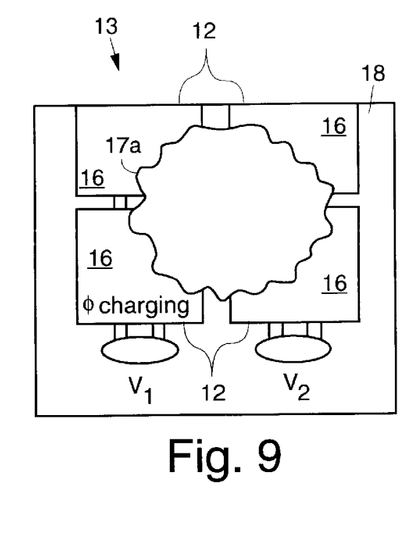
FIG. 9 illustrates the spacecraft arc charging triggers a sustained discharge driven by the array string current and voltage.

A simple theoretical model was developed for generating a plasma by a discharge between the solar cell 12 and its cover glass 16. FIGS. 7–9 sequentially illustrates what happens. First, the solar array 13 charges due to the space environment (FIG. 7). The insulated cover glass 16 is discharged due to photoemission of electrons, leading to a differential charge between the cover glass 16 and the solar cells 12. Next, an electrostatic discharge occurs between the cover glass 16 and a solar cell 12 (FIG. 8). This "triggering arc" 17 is known to occur at a differential voltage of several hundred volts. The discharge contains very little energy and is, of itself, harmless.

However, a plasma created by the triggering arc 17 can collect current from the array 13 itself, leading to a "sustained arc" 17a (FIG. 9). The energy in this discharge, the product of the discharge current and the plasma voltage, can be substantial, and can be sufficient to pyrolize the Kapton insulating material 19. Thus phenomenon has been captured on film in NASA Lewis Research Center (LeRC) tests described below, and is quite spectacular.

The trigger current model is for spherical expansion of the plasma generated during solar cell discharge. The energy in the discharge, the product of the discharge current and the charging voltage, generates a plasma at the arc site by ionization. The plasma is assumed to expand spherically from the arc site at a velocity of $3 \times 10^4$ m/s, a typical value based upon other experimental studies. The electron and ion plasma densities are shown to vary as $1/r^2$, where r is the distance from the arc site.

The saturation current density collectible from the arc discharge plasma is estimated assuming that the electrons in the plasma have a Maxwellian velocity distribution with a temperature of 1.5 eV, which is typical for low discharge generated plasmas. The saturation current is the maximum current that can flow into the plasma from the solar array 13 if the potential of the collecting solar cell 12 is above the plasma potential. If the saturation current is greater than the maximum current in the solar array 13, it will limit the current.

Figure 10:
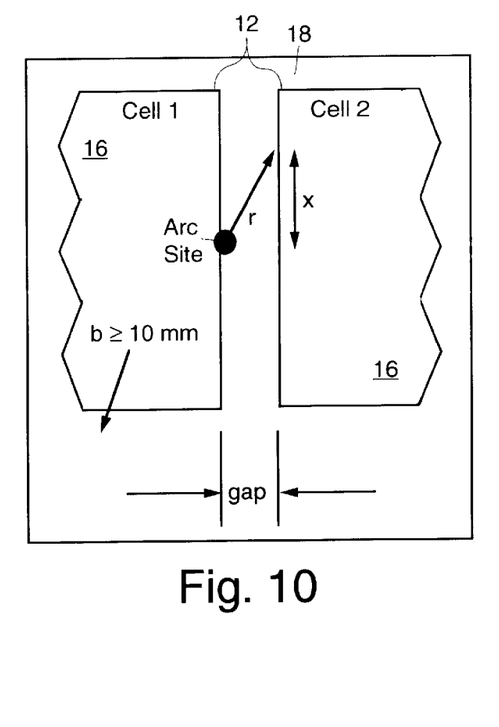
FIG. 10 illustrates a top view of the array showing an intercell gap.

The maximum current carried by the trigger arc 17 is found by integrating the plasma thermal electron current density over the exposed conduction surface area of adjacent cells 12, as shown in FIG. 10.

Maximum circuit current is found by integration over x, the distance along the cell:

$$I_{max} = h \int_{-\infty}^{\infty} \frac{j_e(1)}{g^2 + x^2} dx = \pi \frac{h j_e(1)}{g}$$

where h is the cell height, g is the intercell gap distance, and $j_e(1)$ is the current density at a distance of one meter from the arc site.

For the geometry of the solar arrays 13 in orbit that were developed by the assignee of the present invention, the saturation current was found to be 2.6 A, for an assumed discharge voltage of 500 V. Coincidentally, the maximum current available from the solar array 13 is almost identical (2.1 to 2.6 Amps per circuit for the GaAs arrays 13, and 2.3 to 3.4 Amps per circuit for the Si arrays 13).

Figure 11:
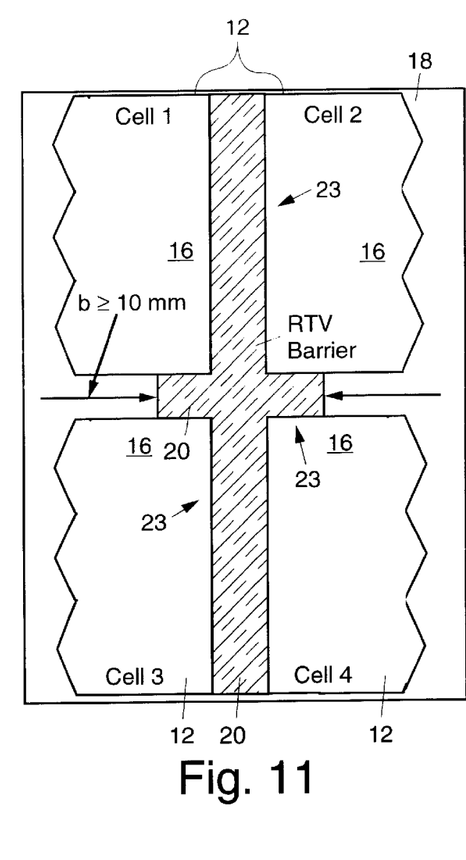
FIG. 11 illustrates the use of an insulating barrier between cells in accordance with the principles of the present invention.

FIG. 11 illustrates the use of a protective insulating barrier 20 (RTV adhesive 20) installed in gaps 23 between cells 12 in accordance with the principles of the present invention. Using the same modeling techniques, and the geometry of GaAs arrays 13 developed by the assignee of the present invention, the maximum current is reduced from 2.6 Amps to 0.15 Amps, which is a reduction factor of 17.

Presented below is a summary of the sustaining current model developed by the assignee of the present invention.

Step 1: The plasma expands spherically from a spot (arc site) of diameter ≈10 μm, $$n_i = \frac{I_i}{ev_i 4\pi r^2}.$$

Step 2: The arc electron current flows through a hemisphere $$j_e = \frac{I_e}{2\pi r^2}.$$

Step 3: The scattering is dominated by classical electron-ion collisions $$v_{ei} = 3.9 \times 10^{-12} n_e \Lambda T_e^{-3/2}$$

$$\Lambda = 30 - \ln(n_e^{1/2} T_e^{-3/2}).$$

Step 4: The classical conductivity is given by σ=ε₀ω_p/Vei.

Step 5: The voltage drop found by integrating over the radius $$V(r) = \int_{r0}^{r} \frac{I_e}{\sigma 2\pi r^2} dr.$$

The intercell voltage threshold effect will now be discussed. The voltage drop calculated in step 5 above is the potential drop in the plasma due to the ohmic resistance of the plasma to the discharge current. The voltage drop is in the range of 40 V, for reasonable assumptions of emission spot radius and ion current. The solar array 13 only collects electron current if the cell-to-cell bias voltage is greater than the resistive drop in the arc plasma. The current collected drops exponentially for bias voltages less than the local plasma potential.

Laboratory tests have been performed which validate this theory and which have led to a further understanding of the mechanisms that are involved. The tests successfully reproduced the failure symptoms observed in orbit, and provided great insight into the details of the controlling mechanisms.

A simple model for the generation of a plasma by trigger arc discharge of the cover glass 16 to the solar cell 12 has thus been developed. This analytical model is supported by the experimental data from testing performed at the NASA Lewis Research Center. In these tests, a solar panel coupon is installed in a thermal vacuum chamber with the potential between cells 12 adjustable externally.

Figure 12:
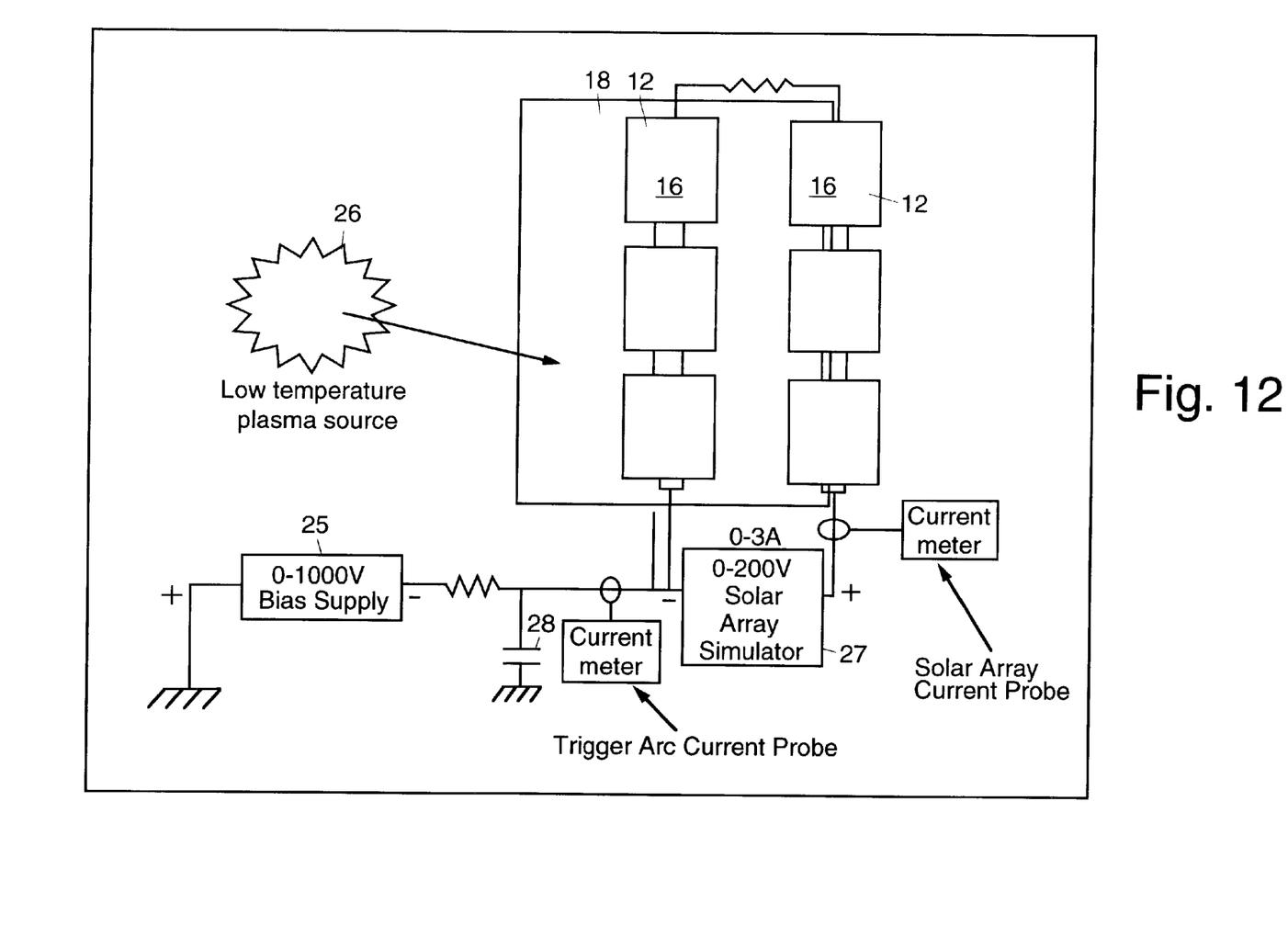
FIG. 12 illustrates a test setup used to test the present invention.

The test setup, shown in FIG. 12, provides an inverted voltage gradient between the cover glass 16 and the solar cells 12 and their substrate 18. A bias supply 25 is used to set the substrate and cell ground return negative relative to chamber ground. A plasma source 26 is used to flood the cover glass 16 with a low energy (1–2 eV) low density plasma and thereby maintain the potential of the cover glass 16 near the chamber ground. A solar array simulator (SAS) 27 is used to simulate the voltage and current from the solar array 13 and provides for the differential cell voltages which are necessary to create the sustaining arc. The bias supply 25 charges a capacitor 28. The value of the capacitor 28 and the bias supply voltage determine the energy available to the arc discharge.

This arrangement is actually more representative of a low earth orbit environment, and is thought to represent a significantly worst case scenario for geosynchronous earth orbit. Failures that occur infrequently in geosynchronous earth orbit can be systematically induced, leading to rapid verification of protective measures. The geosynchronous earth orbit environment has also been simulated in a solar thermal bacuum chamber of the present assignee. However, arcing at voltages below several thousand volts have not been induced. It appears that the phenomenon does not occur in a perfect vacuum, and a plasma medium must be present to initiate the arc.

The amount of energy that can be stored during spacecraft charging is proportional to the capacitance of the solar cell 12 and cover glass 16 combination. A capacitor 28 in the test setup shown in FIG. 12 is used to control the energy of the trigger arc. Capacitance values up to twice the capacitance of an entire solar panel 13 are used to demonstrate margin.

The number of arcs for a 30 minute period are plotted versus bias supply voltage. From these tests the arc threshold voltage between cover glass 16 and solar cell 12 is determined. The test also measures the current waveforms for all arc discharges. The instrumentation allows the initial trigger arc to be visible and the absence or presence of a sustaining arc can be observed. The SAS voltage is increased in steps to determine the safe intercell voltage operating range.

Figure 13:
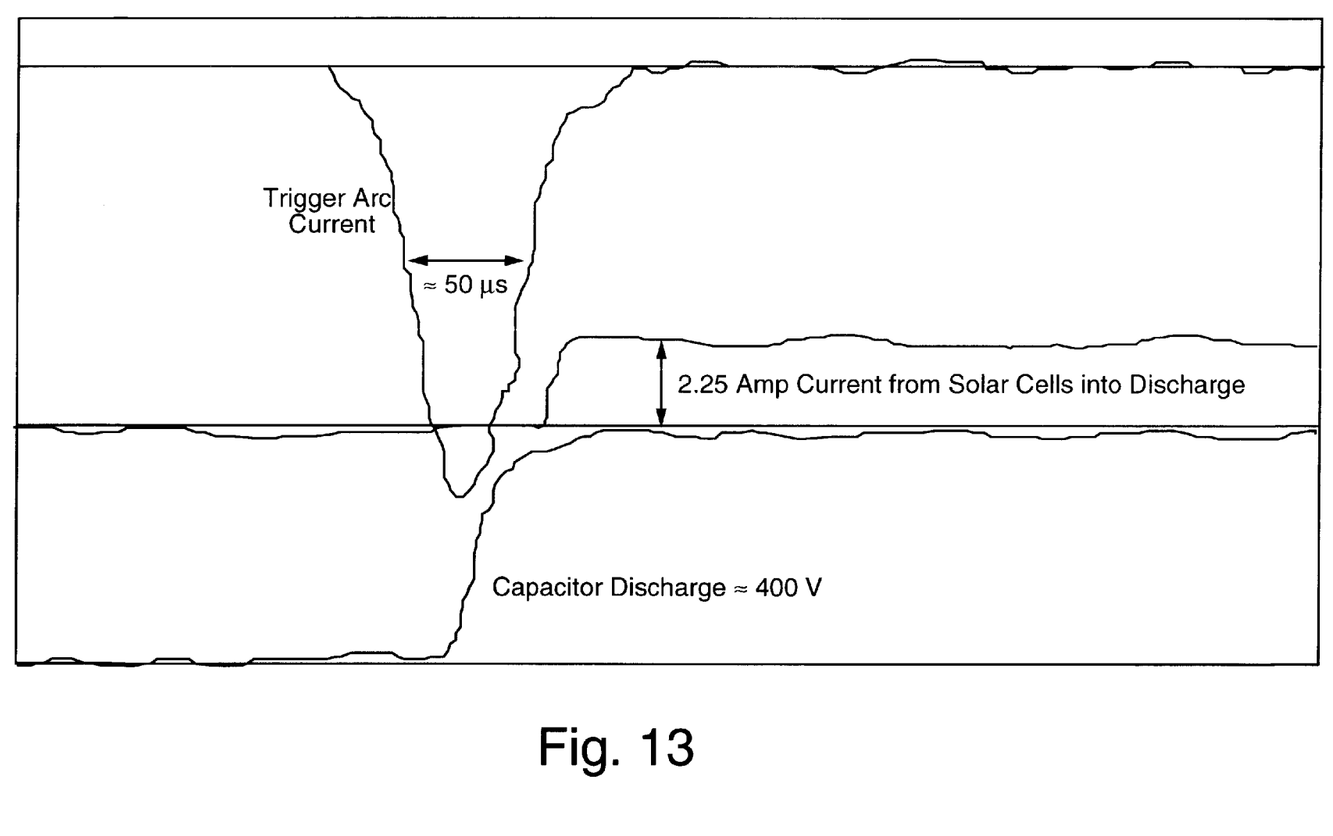
FIG. 13 illustrates an example of solar array augmented discharge leading to failure.

Test results from the solar array 12 for a GaAs solar cell coupon with the same construction as on the on-orbit spacecraft 10 is shown in FIG. 13. More specifically, FIG. 13 illustrates solar array augmented discharge leading to failure. The solar cell bias was set to 80 V and the solar array current limit set to 2.25 Amps, close to the limit of the actual on-orbit operating conditions. The current supplied by the solar array 13 rises immediately to the current limit value. The dissipation of this large initial circuit current at the collecting cell 12 resulted in overheating and sustaining of the discharge beyond the 100 μsec of the trigger arc. The result was a cell-to-cell and cell-to-substrate short.

A number of tests similar to the one described above have been performed. The results show that failures can be induced in both the Si and the GaAs arrays 13 of the type launched by the assignee of the present invention. As predicted by the model, there is a voltage threshold value below which the trigger arc extinguishes itself within μsec, although the exact value of the threshold cannot be determined because it is dependent upon the precise geometry of the arc site.

Figure 14:
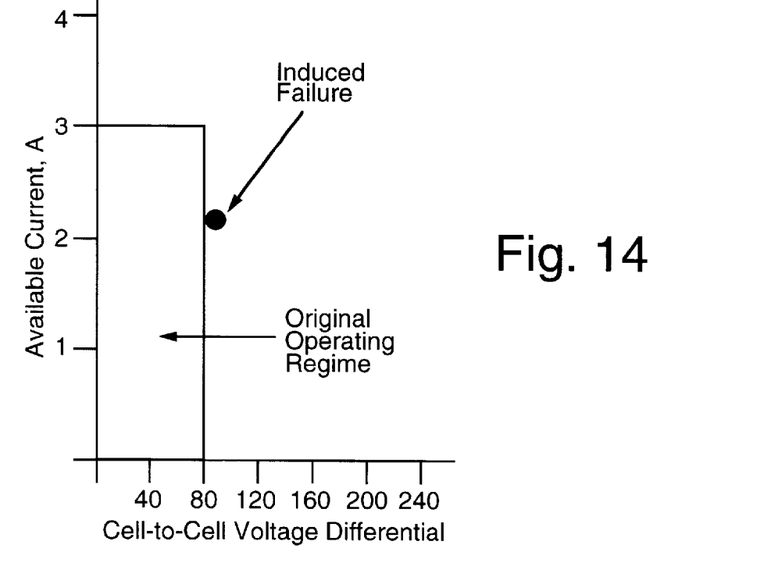
FIG. 14 illustrates a measured GaAs coupon failure threshold.
Figure 15:
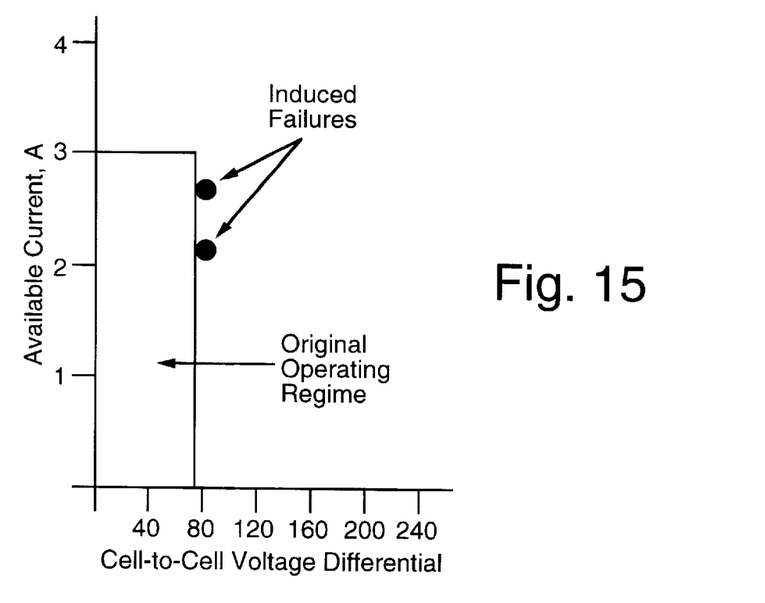
FIG. 15 illustrates a measured Si coupon failure threshold.

FIGS. 14 and 15 show that the onset of failure is just at the boundary of the on-orbit cell operating regime. No current to the solar cells 12 was observed in any NASA LeRC testing for cell voltages below 60 V, which is consistent with the magnitude of the threshold predicted by the model described above.

Figure 16:
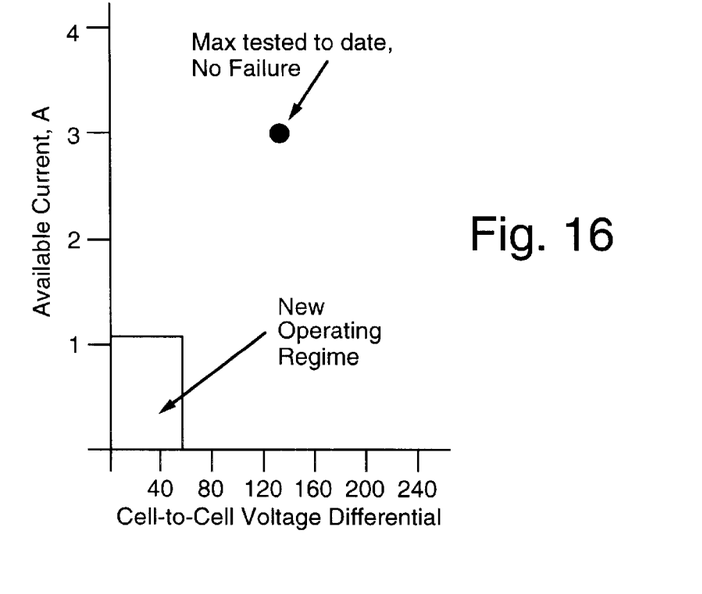
FIG. 16 illustrates a GaAs coupon failure threshold with the present insulating barrier installed.
Figure 17:
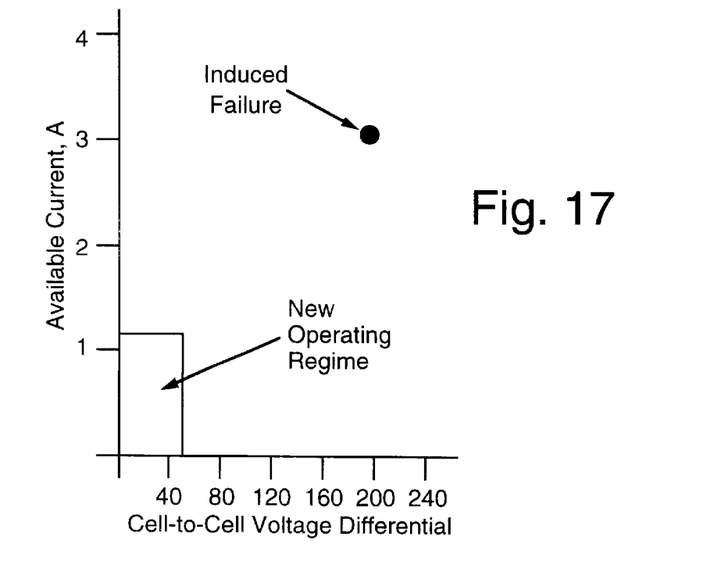
FIG. 17 illustrates a Si coupon failure threshold with the present insulating barrier installed.

Testing of samples with the insulating (RTV) barrier 20 installed in the gap between cells 12, as shown in FIG. 1, has demonstrated the effectiveness of the insulating (RTV) barrier 20, with the failure threshold being increased significantly beyond the operating regime. This is shown in FIGS. 16 and 17. At the present time, both Si and GaAs coupons, manufactured in accordance with the principles of the present invention that will be used for future flights, are undergoing testing at NASA LeRC. The test procedure is set up to demonstrate margins of safety with respect to generation of a sustaining arc of at least a factor of 2 in voltage, and at least a factor of 2 in discharge energy (twice the capacitance equal to an entire panel 13). A minimum of 240 arcs are recorded for each case in the test matrix.

Testing of a GaAs coupon with insulating (RTV) barrier 20 installed has been completed. Discharge occurred at inverse gradient voltages of 290 to 530 V, and discharge voltage increases with time which could indicate that the threshold increases subsequent to arcs occurring at "weaker" locations.

The coupon experienced over 1000 arc discharges. The current recordings during the discharges showed that the insulating (RTV) barrier 20 is successful in limiting the flow of current into the plasma formed by the trigger arc. Current from the solar array simulator was generally in the 0.2 to 0.4 A range during the 50 to 100 μsec duration of the discharge. There were no cell-to-cell or cell-to-substrate shorts, and there were no instances of sustained arcing being fed by the solar array simulator. The conclusion is that the insulating (RTV) barrier 20 is effective in preventing the sustaining arc, as predicted by theory. In fact, previous experimental samples subjected to testing at far higher voltages showed that the ultimate damage occurred beyond the insulating (RTV) barrier 20 and that much higher cell-to-cell voltages were required to initiate such damage.

For future high power spacecraft to be launched by the assignee of the present invention, three corrective actions have been undertaken, any of which is sufficient to prevent damage from the phenomenon described in this paper. Together, significant margin is demonstrated.

Figure 18:
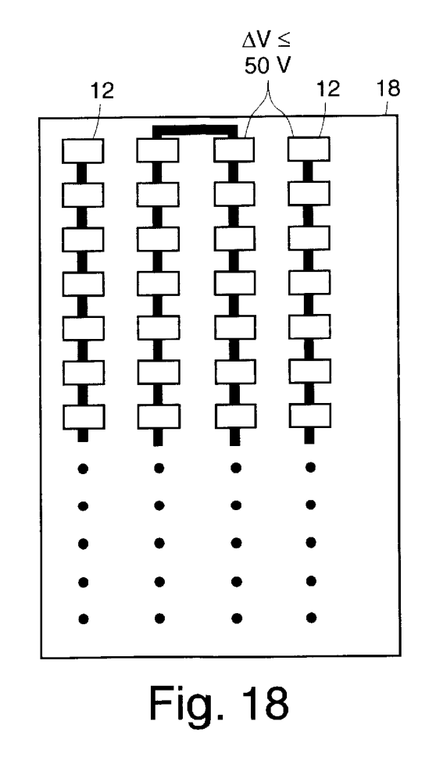
FIG. 18 illustrates a solar cell layout in accordance with the present invention wherein the cell-to-cell voltage is limited to 50 V or less.

First, solar array panels 13 are wired in accordance with the principles of the present invention so that the voltage between adjacent cells 12 is 50 V or less, as is shown in FIG. 18. The previous high powered spacecraft 10 had cases of 80 V (GaAs) and 75 V (Si) differentials between adjacent cells. Extensive analysis is used to ensure that this differential limit is not exceeded for various combinations of shunted and unshunted strings 11 of solar cells 12, shadowing cases, and cases of failed strings 11. The assignee of the present invention typically operates arrays at voltages up to 50 V, with excellent reliability results.

Figure 19:
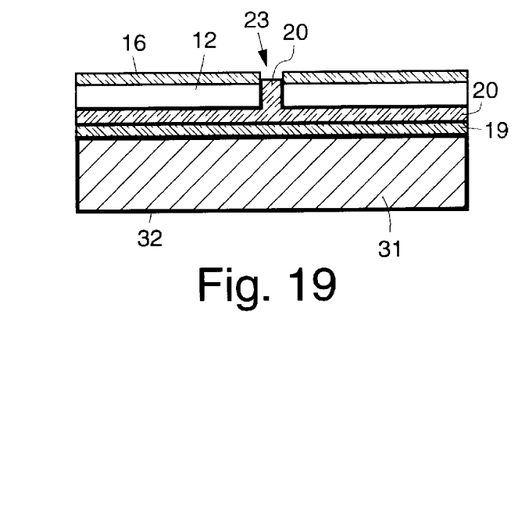
FIG. 19 illustrates that the insulating barrier protects exposed Kapton insulator.

Second, as shown in FIG. 11 and in detail in FIG. 19, the insulating barrier 20, such RTV adhesive 20 or insulating material 20, is inserted in all gaps 23 between cells 12, and for a distance of at least 10 mm in the crossing gaps between series connected cells 12. As is shown in FIG. 19, the structure of the improved solar array 13 comprises a substrate 30 having an aluminum core 31 surrounded by a graphite skin 32. The Kapton insulating layer 19 is diposed on top of the substrate 30. The (RTV) insulating material 20 is disposed between the Kapton insulating layer 19 and bottom surfaces of the solar cells 12 and in the gaps 23 between the solar cells 12. Cover glass 16 covers exposed surfaces of the the solar cells 12. Testing of sample solar arrays 13 during the development of this process has shown that it increases the threshold for damage to about 200 V.

Figure 20:
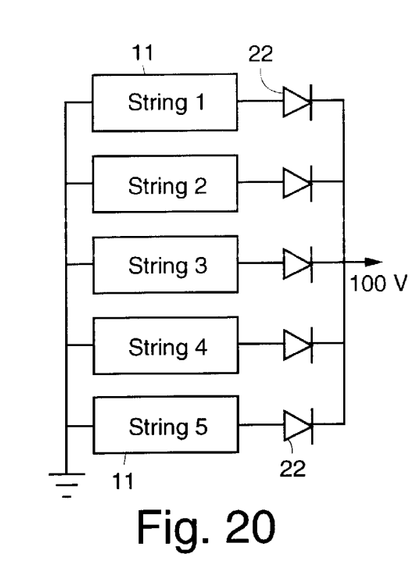
FIG. 20 illustrates that each solar cell string is isolated by diodes, limiting the current available to an arc.

Third, an as is shown in FIG. 20, for arrays 13 in orbit, there are as many as five GaAs strings 11 in parallel, and as many as three Si strings 11 in parallel, to form a "circuit". Each circuit utilizes an individual solar array drive assembly (SADA) slip ring, and is connected to an individual switching shunt element (see FIG. 1). This arrangement provides up to 3.4 Amps (Si) and 2.6 Amps (GaAs) to feed the discharge.

Future GaAs arrays will use larger cells 12, such that the individual strings 11 will have current capability substantially identical to the Si arrays 13. Parallel strings 11 will be separated by diodes 22, as is shown in FIG. 20, on all unlaunched spacecraft 10 so that the most current available to an arc will be 1.1 A for both the Si and GaAs panels 13. This has the inherent benefit of a significant increase in calculated reliability, even without considering the phenomenon described in this paper, at a small penalty in efficiency of the solar array 13.

Figure 21:
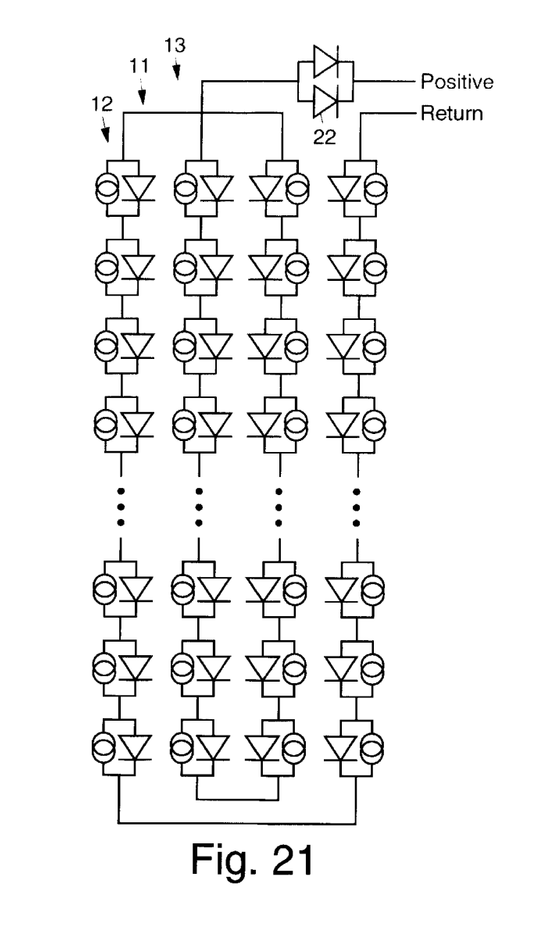
FIG. 21 illustrates a exemplary solar cell circuit layout in accordance with the present invention that is resistant to electrostatic discharge.
Figure 22:
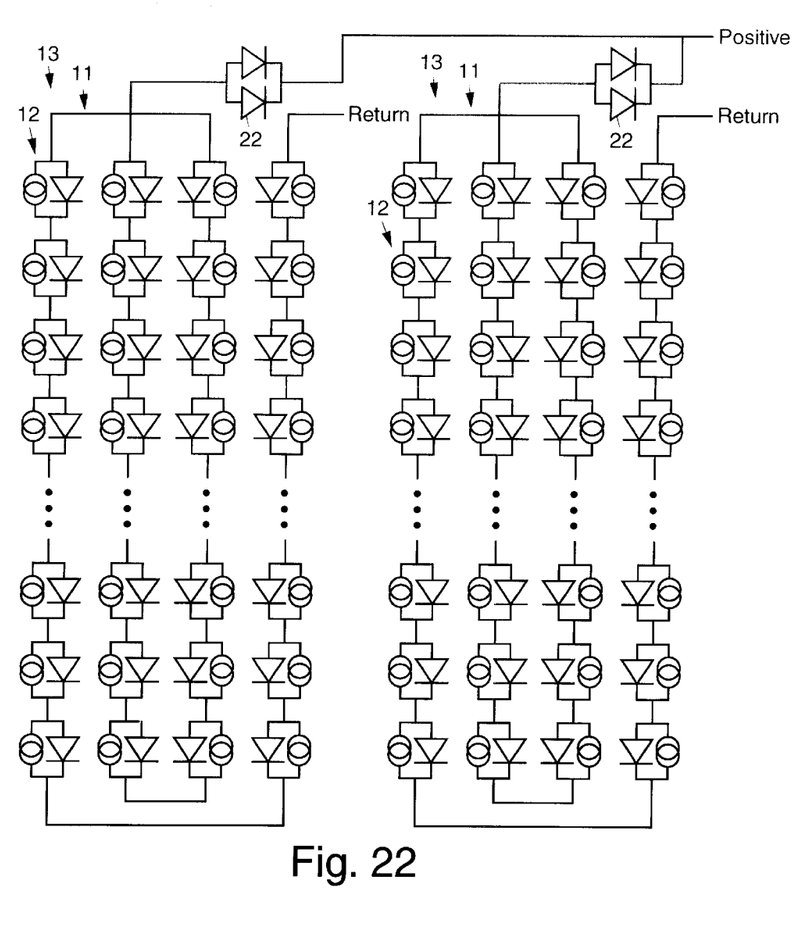
FIG. 22 illustrates an exemplary solar cell circuit layout in accordance with the present invention that provides for electrostatic discharge current limiting.

Additional details regarding the structures discussed with reference to FIGS. 18–20 are presented below. In particular, two high voltage solar array designs are shown in FIGS. 21 and 22, respectively. The present invention provides for techniques for designing solar panels 13 for use at high power levels. As was mentioned previously, prior solar panel designs that are to operated at voltages greater than 70 V, for example, had the potential to fail when the space environment caused electrostatic discharge. The present invention allows use of solar panel voltages over 70 volts. Solar panels 13 produced in accordance with the principles of the present invention are more robust to electrostatic discharge.

A first exemplary circuit layout accordance with the present invention is shown in FIG. 21 that is resistant to electrostatic discharge. Solar cell circuits to be used for spacecraft power systems may be assembled from all commonly used photovoltaic devices, including silicon, gallium arsenide and multi-bandgap cells. As is shown in FIG. 21, the solar cells 12 are arranged on the solar panels 13 in a pattern that prevents adjacent solar cells 12 from having voltage potential greater than 50 volts. A spiral interconnection arrangement is used to serially interconnect the solar cells 12 together. Furthermore, isolation or blocking diodes 22 are used to limit reverse current through a shorted circuit.

Referring to FIG. 22, it illustrates a exemplary solar cell circuit layout in accordance with the present invention that provides for electrostatic discharge current limiting. When circuits are to be connected in parallel, the prevention of reverse current through a shorted circuit should be limited to less than 1.5 Amps. The use of the isolation or blocking diodes 22 is one means for limiting the reverse current through the shorted circuit. The circuit layout shown in FIG. 22 provides for electrostatic discharge current limiting. The addition of insulating material (the insulating barrier 20) disposed between the solar cells 12, such as RTV insulating material 20 or adhesive 20, for example, as is illustrated in FIG. 19, provides further protection from electrostatic discharge for voltages in excess of 100 volts.

Thus, improved solar cell circuit layouts including means for protecting solar arrays located on spacecraft disposed in geosynchronous earth orbit from electrostatic discharge have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A solar array comprising:
   a substrate;
   a plurality or groups of series-connected solar cells separated from each other by gaps;

an insulating barrier disposed between the substrate and the solar cells, and disposed in the gaps between the groups of scrics-connected solar cells, and disposed so as to project away from the gaps a predetermined distance into crossing gaps between series connected solar cells of each group, and wherein the insulating barrier only partially fills the crossing gaps; and cover glass disposed over the plurality of solar cells to cover exposed surfaces thereof.

2. The solar array of claim 1 wherein the substrate comprises an aluminum core surrounded by a graphite skin.

3. The solar array of claim 1 wherein the insulating barrier comprises an insulating adhesive.

4. The solar array of claim 1 wherein the insulating adhesive comprises room temperature vulcanizable (RTV) adhesive.

5. The solar array of claim 1 further comprising an insulating layer disposed between the substrate and the plurality of solar cells.

6. The solar array of claim 1 wherein the insulating layer comprises Kapton material.

7. The solar array of claim 1 wherein the predetermined distance is at least 10 mm in the crossing gaps between series cells.

8. The solar array of claim 1 wherein the solar cells are wired together so that the voltage between adjacent cells is 50 V or less.

9. The solar array of claim 8 wherein the solar cells are wired together in a spiral interconnection pattern to serially interconnect the solar cells together, and which prevents adjacent solar cells from having voltage potential greater than 50 volts.

10. The solar array of claim 1 further comprising a plurality of isolation diodes coupled to respective outputs of interconnected ones of the solar cells to limit reverse current through a shorted solar cell.

11. A solar array comprising:

a substrate;

an insulating layer disposed on the substrate;

a plurality of groups of series-connected solar cells separated from each other by gaps:

an insulating barrier disposed between the insulating layer and the solar cells, and disposed in the gaps between the groups of series-connected solar cells, and disposed so as to project away from the gaps a predetermined distance into crossing gaps between series connected solar cells of each group, and wherein the insulating barrier only partially fills the crossing gaps; and cover glass disposed over the plurality of solar cells to cover exposed surfaces thereof.

12. The solar array of claim 11 wherein the substrate comprises an aluminum core surrounded by a graphite skin.

13. The solar array of claim 11 wherein the insulating barrier comprises an insulating adhesive.

14. The solar array of claim 11 wherein the insulating adhesive comprises room temperature vulcanizable (RTV) adhesive.

15. The solar array of claim 11 wherein the insulating layer comprises Kapton material.

16. The solar array of claim 11 wherein the predetermined distance is at least 10 mm in the crossing gaps between series cells.

17. The solar array of claim 11 wherein the solar cells are wired together so that the voltage between adjacent cells is 50 V or less.

18. The solar array of claim 17 wherein the solar cells are wired together in a spiral interconnection pattern to serially interconnect the solar cells together, and which prevents adjacent solar cells from having voltage potential greater than 50 volts.

19. The solar array of claim 11 further comprising a plurality of isolation diodes coupled to respective outputs of interconnected ones of the solar cells to limit reverse current through a shorted solar cell.

\* \* \* \* \*